(12) United States Patent
Sasaki et al.

(10) Patent No.: US 9,338,906 B2
(45) Date of Patent: May 10, 2016

(54) COVER FILM

(75) Inventors: Akira Sasaki, Isesaki (JP); Hisatsugu Tokunaga, Isesaki (JP); Tetsuo Fujimura, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 184 days.

(21) Appl. No.: 14/112,054

(22) PCT Filed: Apr. 18, 2011

(86) PCT No.: PCT/JP2011/059532
§ 371 (c)(1),
(2), (4) Date: Oct. 31, 2013

(87) PCT Pub. No.: WO2012/143994
PCT Pub. Date: Oct. 26, 2012

(65) Prior Publication Data
US 2014/0057064 A1 Feb. 27, 2014

(51) Int. Cl.
*B32B 27/34* (2006.01)
*B32B 27/08* (2006.01)
*B32B 7/06* (2006.01)
*B32B 27/20* (2006.01)
*B32B 27/30* (2006.01)
*B32B 27/32* (2006.01)
*B65D 43/02* (2006.01)
*H05K 5/03* (2006.01)
*B32B 7/12* (2006.01)
*B32B 27/36* (2006.01)
*C09J 7/02* (2006.01)
*B65D 75/32* (2006.01)
*B65D 75/42* (2006.01)
*C08K 3/04* (2006.01)

(52) U.S. Cl.
CPC .. *H05K 5/03* (2013.01); *B32B 7/06* (2013.01); *B32B 7/12* (2013.01); *B32B 27/08* (2013.01); *B32B 27/20* (2013.01); *B32B 27/205* (2013.01); *B32B 27/302* (2013.01); *B32B 27/32* (2013.01); *B32B 27/34* (2013.01); *B32B 27/36* (2013.01); *C09J 7/0296* (2013.01); *B32B 2255/10* (2013.01); *B32B 2255/26* (2013.01); *B32B 2264/102* (2013.01); *B32B 2264/104* (2013.01); *B32B 2307/202* (2013.01); *B32B 2307/31* (2013.01); *B32B 2307/518* (2013.01); *B32B 2307/748* (2013.01); *B32B 2457/00* (2013.01); *B65D 75/325* (2013.01); *B65D 75/42* (2013.01); *B65D 2585/86* (2013.01); *C08K 3/04* (2013.01); *C09J 2201/602* (2013.01); *C09J 2201/61* (2013.01); *C09J 2205/102* (2013.01); *C09J 2205/106* (2013.01); *C09J 2205/114* (2013.01); *C09J 2425/00* (2013.01); *C09J 2433/00* (2013.01); *Y10T 428/1405* (2015.01); *Y10T 428/1462* (2015.01)

(58) Field of Classification Search
None
See application file for complete search history.

(56) References Cited

U.S. PATENT DOCUMENTS

2010/0266826 A1* 10/2010 Yonezawa ................. 428/216

FOREIGN PATENT DOCUMENTS

| | | |
|---|---|---|
| JP | A-8-119373 | 5/1996 |
| JP | A-10-250020 | 9/1998 |
| JP | A-2000-327024 | 11/2000 |
| JP | 2002-154573 A | 5/2002 |
| JP | A-2003-300582 | 10/2003 |
| JP | 2005-263257 A | 9/2005 |
| JP | A-2006-182418 | 7/2006 |
| JP | A-2006-327624 | 12/2006 |
| JP | A-2007-331783 | 12/2007 |
| JP | B1-4438906 | 3/2010 |
| KR | 2001-0079215 A | 8/2001 |

OTHER PUBLICATIONS

International Search Report issued in International Patent Application No. PCT/JP2011/059532 dated Jul. 19, 2011.
Feb. 9, 2015 Office Action issued in Taiwanese Patent Application No. 100114207.
Extended European Search report issued in European Application No. 11864064.8 dated Sep. 1, 2014.

* cited by examiner

*Primary Examiner* — Sheeba Ahmed
(74) *Attorney, Agent, or Firm* — Oliff PLC

(57) ABSTRACT

Disclosed is a cover film, which includes at least a base layer, an intermediate layer, a releasing layer and a heat seal layer that can be heat-sealed to a carrier tape, and wherein the heat seal layer contains, as a main component, a styrene-acrylic copolymer that has a mass average molecular weight of 5000 to 20000. This cover film is suppressed in variation in release strength when separated from the carrier tape, and is capable of reducing problems in the mounting process of electronic components such as rupture of the cover film during the separation.

15 Claims, 1 Drawing Sheet

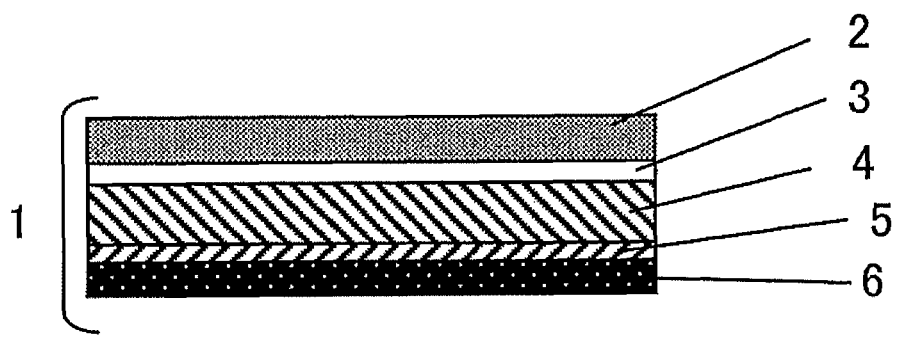

COVER FILM

TECHNICAL FIELD

The present invention relates to a cover film used in packages for electronic components.

BACKGROUND ART

With the miniaturization of electronic devices, the electronic components used therein have also become progressively smaller and of higher performance, and the components are automatically mounted on printed circuit boards during assembly of the electronic devices. Surface-mounted electronic components are housed in carrier tape with pockets that are consecutively formed by thermoforming in accordance with the shapes of the electronic components. After loading the electronic components, a cover film is laid as a lid material over the top surface of the carrier tape, and the ends of the cover film are continuously heat-sealed in the longitudinal direction with a heated seal bar to form packages. As the cover film material, one having a heat seal layer of thermoplastic resin laminated onto a biaxially stretched polyester film substrate is used. The carrier tape is a thermoplastic resin, such as a polystyrene or a polycarbonate.

In recent years, electronic components such as capacitors, resistors, IC's, LED's, connectors and switching elements have become increasingly smaller, lighter and thinner, and it has become increasingly difficult to achieve the desired performance when peeling cover films to remove the electronic components contained inside from the packages. In particular, the peel strength when peeling the cover film from the carrier tape should continuously be within a certain range of values. The smaller and lighter the electronic components to be housed become, the more likely that the electronic components will fly out due to vibrations when peeling, resulting in problems during the mounting process.

In other words, when mounting components during the production of electronic devices and the like, the cover film is peeled from the carrier tape by an automatic peeling device, but if the peel strength is too strong, the cover film can be torn, and if too weak, the cover film may separate from the carrier tape during carrier transport, causing the electronic components inside to spill out. In particular, with the sudden increases in mounting speed, the peel speed of cover films has become very fast, with takt times of 0.1 seconds or less, and large impact stresses are applied to the cover film during peeling. As a result, the problem known as "film rupture" wherein the cover film is severed can occur.

As a measure against this kind of film rupture, a method of providing a layer of polypropylene, nylon or polyurethane excelling in impact resistance or tear propagation resistance between a substrate of a biaxially stretched polyester film or the like and a sealant layer has been proposed (see Patent Documents 1 to 3). Additionally, a method of preventing propagation of stress to the substrate layer by using a metallocene linear low-density polyethylene with a certain specific gravity as the intermediate layer to lower the Young's modulus of an adhesive layer between this intermediate layer and the substrate layer has been proposed (see Patent Document 4). However, even with these methods, it is difficult to suppress film ruptures during high-speed peeling such as 100 m per minute.

Additionally, packages for housing electronic components need to be baked in order to remove moisture contained in the sealing resins. In order to improve the productivity of such electronic components, the baking temperature must be raised to shorten the baking time. Recently, baking has usually been performed for 72 hours in a 60° C. environment or for 24 hours in a 80° C. environment with a cover film heat-sealed to a carrier tape. In such cases, the electronic components may adhere to the heat-seal surfaces of the cover film, causing mounting defects when mounting the components on a substrate. However, such problems of component adherence have not been sufficiently considered conventionally.

RELATED ART

Patent Documents

Patent Document 1: JP-A H8-119373
Patent Document 2: JP-A H10-250020
Patent Document 3: JP-A 2000-327024
Patent Document 4: JP-A 2006-327624

SUMMARY OF THE INVENTION

The present invention was made in view of the aforementioned circumstances, and primarily addresses the problem of offering a cover film that at least partially solves the drawbacks of conventional cover films.

More specifically, the present invention addresses the problem of offering a cover film for use in carrier tapes of polystyrene and polycarbonate or the like, wherein the peel strength when peeling the cover film to extract electronic components is continuously within a certain range, and the increase in peel strength is small even during high-speed peeling, thereby preventing problems in the mounting process such as small electronic components spilling out due to vibrations when peeling, rupture of the cover film during high-speed peeling and component adherence due to baking.

As a result of diligent study of the aforementioned problem, the present inventors found that a cover film that overcomes the problems addressed by the present invention can be obtained by providing a heat seal layer comprising a specific thermoplastic resin having a specific mass-average molecular weight, thereby achieving the present invention.

In other words, according to one embodiment, the present invention offers a cover film comprising at least a substrate layer (A), an intermediate layer (B), a peel layer (C) and a heat seal layer (D) capable of being heat-sealed to a carrier tape; wherein the heat seal layer (D) comprises, as a main component, a styrenic-acrylic copolymer having a mass-average molecular weight of 5000 to 20000.

According to one embodiment, the styrenic-acrylic copolymer of the heat seal layer (D) is a resin having a glass transition temperature of 70 to 100° C.

In another embodiment, the peel layer (C) comprises, as a main component, a hydrogenated aromatic vinyl-conjugated diene copolymer having an aromatic vinyl content of 15 to 35 mass %. Additionally, the peel layer (C) and/or the heat seal layer (D) comprise a conductive material. In one embodiment, this conductive material is conductive microparticles, comprising acicular or spherical microparticles, or a combination thereof. The conductive material may, for example, be a carbon nano-material.

Furthermore, the present invention also covers an electronic component package wherein the above-described cover film is used as a lid material of a carrier tape having a thermoplastic resin as the main component.

According to the present invention, a cover film for use with a carrier tape of polystyrene and polycarbonate or the like is formed using a specific thermoplastic resin having a specific mass-average molecular weight as a heat seal layer, resulting in a cover film wherein the peel strength when peeling the cover film to extract electronic components is continuously within a certain range, and the increase in peel strength is small even during high-speed peeling, thereby preventing problems in the mounting process such as small electronic components spilling out due to vibrations when peeling, rupture of the cover film during high-speed peeling and component adherence due to baking.

BRIEF DESCRIPTION OF THE DRAWINGS

FIG. 1 is a section view showing an example of the layer structure of the cover film of the present invention.

MODES FOR CARRYING OUT THE INVENTION

The cover film of the present invention comprises at least a substrate layer (A), an intermediate layer (B), a peel layer (C) and a heat seal layer (D) in that order. An example of the structure of the cover film of the present invention is shown in FIG. 1.

The substrate layer (A) is a layer comprising a biaxially stretched polyester or a biaxially stretched nylon, of which biaxially stretched polyethylene terephthalate (PET), biaxially stretched polyethylene naphthalate (PEN), biaxially stretched 6,6-nylon or 6-nylon and biaxially stretched polypropylene are particularly preferred. The biaxially stretched PET, biaxially stretched PEN, biaxially stretched 6,6-nylon, biaxially stretched 6-nylon or biaxially stretched polypropylene may be of types that are generally used, or be coated with or contain an anti-static agent for an anti-static treatment, or may be subjected to a corona treatment or an easy-adhesion treatment. If the substrate layer is too thin, the tensile strength of the cover film itself decreases, so "film rupture" tends to occur when peeling the cover film. On the other hand, if too thick, the heat sealability of the carrier tape decreases and the cost increases, so one of thickness 12 to 25 µm is normally preferred.

In the present invention, an intermediate layer (B) is laminated onto one surface of the substrate layer (A) via an adhesive layer as needed. The resin for constituting the intermediate layer (B) is preferably a linear low-density polyethylene (hereinafter referred to as LLDPE), which is flexible and has an appropriate degree of rigidity, and excels in tear strength at standard temperature. By using a resin with a density in the range of 0.900 to 0.925 ($\times 10^3$ kg/m$^3$) in particular, the resin of the intermediate layer is not squeezed out from the end portions of the cover film due to the heat and pressure of heat sealing, so that the iron will not be easily soiled during heat sealing, and the intermediate layer is softened when heat-sealing the cover film, thereby alleviating contact spots of the heat sealing iron and resulting in stable peel strength when peeling the cover film.

LLDPEs include those that are polymerized by a Ziegler catalyst and those that are polymerized by a metallocene catalyst (hereinafter referred to as m-LLDPEs). m-LLDPEs enable strict control of the molecular weight distribution and have especially high tear strength, and are therefore favorably used for the intermediate layer (B) of the present invention.

The above-described m-LLDPE is a copolymer having, as comonomers, an ethylene and an olefin with at least 3 carbon atoms, preferably a linear, branched or aromatic nucleus-substituted α-olefin with 3 to 18 carbon atoms. Examples of linear mono-olefins include propylene, 1-butene, 1-pentene, 1-hexene, 1-octene, 1-nonene, 1-decene, 1-dodecene, 1-tetradecene, 1-hexadecene and 1-octadecene. Additionally, examples of branched mono-olefins include 3-methyl-1-butene, 3-methyl-1-pentene, 4-methyl-1-pentene and 2-ethyl-1-hexene. Additionally, examples of aromatic nucleus-substituted mono-olefins include styrene and the like. These comonomers, singly or as a combination of two or more types, may be copolymerized with ethylene. The copolymerization may be a copolymerization of a polyene such as butadiene, isoprene, 1,3-hexadiene, dicyclopentadiene and 5-ethylidene-2-norbornene. Among these, those using 1-hexene and 1-octene as comonomers are preferably used for having a high tensile strength and excelling in terms of cost.

The thickness of the intermediate layer (B) is generally 5 to 50 µm, preferably 10 to 40 µm. If the thickness of the intermediate layer (B) is less than 5 µm, the adhesive strength between the substrate layer (A) and the intermediate layer (B) may be inadequate, and it is difficult to achieve the effect of reducing contact spots of the hot iron when heat sealing the cover film onto the carrier tape. On the other hand, if 50 µm is exceeded, the total thickness of the cover film may be too thick, and it may be difficult to obtain sufficient peel strength when heat sealing the cover film onto the carrier tape.

The cover film of the present invention is provided with a peel layer (C) mainly comprising a thermoplastic resin between the intermediate layer (B) and the heat seal layer (D). Examples of the thermoplastic resin that may be used in this peel layer (C) include acrylic resins, polyester resins, ethylene-vinyl acetate copolymer resins (hereinafter referred to as EVA), ethylene-acrylic acid copolymer resins, ethylene-methacrylic acid copolymer resins, styrene-isoprene diblock copolymer resins, hydrogenated styrene-isoprene diblock copolymer resins, styrene-butadiene block copolymer resins, hydrogenated styrene-butadiene diblock copolymer resins, hydrogenated styrene-isoprene-styrene triblock copolymer resins (hereinafter referred to as SEPS), hydrogenated styrene-butadiene-styrene triblock copolymer resins (hereinafter referred to as SEBS), hydrogenated styrene butadiene random copolymer resins and hydrogenated styrene-isoprene random copolymer resins. Among these, SEPS and SEBS having a styrene content of 15 to 35 mass % has little variation in peel strength when peeling the cover film and can be favorably used.

The thickness of the peel layer (C) is usually in the range of 0.1 to 3 µm, preferably 0.1 to 1.5 µm. When the thickness of the peel layer (C) is less than 0.1 µm, sufficient peel strength may not be obtained when heat sealing the carrier tape to a cover film. On the other hand, when the thickness of the peel layer (C) exceeds 3 µm, there is a risk of disparities occurring in the peel strength when peeling the cover film. As will be described below, the peel layer (C) and heat seal layer (D) are normally formed by coating, but when formed by a coating method, the thickness here is the thickness after drying.

The peel layer (C) may include conductive material as needed, preferably conductive microparticles, so as to make the surface resistance preferably $1 \times 10^4$ to $1 \times 10^{12} \Omega$. Examples of conductive microparticles include conductive tin oxide particles, conductive zinc oxide particles and conductive titanium oxide particles. Among these, tin oxide doped with antimony, phosphorus or gallium exhibits high conductivity with little reduction in transparency, and is more preferably used. The conductive tin oxide particles, conductive zinc oxide particles and conductive titanium oxide particles may be spherical, acicular, or a mixture thereof. In particular, when using acicular antimony-doped tin oxide, a cover film having particularly good anti-static performance is obtained. The amount of conductive microparticles added should generally be 100 to 1000 parts by mass, preferably 200 to 800 parts by mass with respect to 100 parts by mass of the thermoplastic resin constituting the peel layer (C). If the amount of conductive microparticles is less than 100 parts by mass, a surface resistance of less than $10^{12}\Omega$ may not be obtained on the heat seal layer (D) side of the cover film, and if the amount exceeds 1000 parts by mass, the relative amount of thermoplastic resin decreases, making it difficult to obtain sufficient peel strength by the heat seal.

The peel layer (C) may comprise, as a conductive material, at least one carbon nanomaterial such as carbon nanotubes or carbon nanofibers. Of these, carbon nanotubes with an aspect ratio of 10 to 10,000 are preferable. The amount of carbon nanomaterial added to the peel layer (C) is 0.5 to 15 parts by mass, preferably 3 to 10 parts by mass with respect to 100 parts by mass of the thermoplastic resin forming the layer. If the amount added is less than 0.5 parts by mass, the effect of providing conductivity by addition of carbon nanomaterials is not sufficient, whereas in excess of 15 parts by mass, the cost increases and the transparency of the cover film is reduced, making it difficult to inspect the contained components through the cover film.

With the cover film of the present invention, a heat seal layer (D) mainly comprising a thermoplastic resin is formed on the surface of the peel layer (C), and a styrenic-acrylic copolymer is used as the thermoplastic resin. The styrenic-acrylic copolymer is a copolymer having styrenic monomers and (meth)acrylic monomers as essential components, example of styrenic monomers being styrene, α-methylstyrene, o-methylstyrene, m-methylstyrene, p-methylstyrene and p-phenylstyrene, among which styrene is particularly preferred. These styrenic monomers may be used singly or as a combination of two or more types. Examples of (meth) acrylic monomers include acrylic acid esters such as methyl acrylate, ethyl acrylate, propyl acrylate and butyl acrylate, and methacrylic acid esters such as methyl methacrylate, ethyl methacrylate, propyl methacrylate, butyl methacrylate and cyclohexyl methacrylate. The (meth)acrylic monomers may be used singly or as a combination of two or more types. Furthermore, in addition to styrenic monomers and (meth) acrylic monomers, a small quantity of other monomers capable of copolymerizing with these monomers may be copolymerized therewith.

The resin mainly comprising a styrenic-acrylic copolymer highly excels in heat sealing ability with respect to polystyrene and polycarbonate which are materials forming carrier tape. Resins having, as main components, styrenic-acrylic copolymers with a mass-average molecular weight of 5000 to 20000, preferably 10000 to 20000, are especially used. Since tackiness occurs with a mass-average molecular weight of less than 5000, the housed components may stick to the heat seal layer (D) and cause mounting problems. On the other hand, if the mass-average molecular weight exceeds 20000, there is a dramatic increase in peel strength when the peel rate is raised, which can cause ruptures. Additionally, the glass transition temperature of the styrenic-acrylic copolymer is preferably 70° C. to 100° C. At less than 70° C., the housed components may adhere to the heat seal surface of the cover film in transportation environments such as in sea mail.

The thickness of the heat seal layer (D) is in the range of 0.1 to 5 µm, preferably 0.1 to 3 µm, and more preferably 0.1 to 0.5 µm. If the thickness of the heat seal layer (D) is less than 0.1 µm, the heat seal layer (D) may not exhibit sufficient peel strength. On the other hand, if the thickness of the heat seal layer (D) exceeds 5 µm, the cost will increase, and there tend to be variations in the peel strength when peeling the cover film.

Furthermore, in a cover film according to a preferred embodiment of the present invention, an inorganic filler is added to the heat seal layer (D). The cover film of the present invention, as described above, may be baked while heat sealed to the surface of a carrier tape containing electronic components for 72 hours in a 60° C. environment or for 24 hours in an 80° C. environment in order to remove the moisture contained in the sealing resin. In such cases, if the electronic components contained therein stick to the cover film, trouble may occur when peeling the cover film and mounting electronic components. In the cover film of the present invention, the variation in peel strength when peeling the cover film is small, and the stickiness of the heat seal layer (D) with respect to the contained electronic components at high temperatures of 60 to 80° C. may be controlled, so such problems of adhesion of electronic components can be solved, but adhesion prevention can be more reliably achieved by adding an inorganic filler to the heat seal layer (D). The inorganic filler added here may be of any type as long as the above-described adhesion prevention is significantly achieved, examples including spherical or crushed talc particles, silica particles, alumina particles, mica particles, calcium carbonate and magnesium carbonate. Additionally, in order to maintain the transparency of the cover film the inorganic filler should have a median size (D50) of less than 200 nm, and 10 to 50 parts by mass, for example, may be included.

Furthermore, in the cover film of the present invention, a conductive material is contained in the peel layer (C), but in one embodiment, a conductive material may be included in the heat seal layer (D) also, and the surface resistance set preferably to $1\times10^4$ to $1\times10^{12}\Omega$. Alternatively, in another embodiment, a conductive material may not be included in the peel layer (C), and a conductive material contained only in the heat seal layer (D). Here, the type and amount of the conductive material contained are similar to those mentioned above for the case of addition to the peel layer (C).

The method for producing the above-described cover film is not particularly restricted, and any common method may be used. For example, an adhesive of polyurethane, polyester, polyolefin or polyethyleneimine can be coated onto the surface of a substrate layer (A), for example, of biaxially stretched polyester, then a resin composition mainly comprising m-LLDPE to form an intermediate layer (B) can be extruded from a T-die, and coated onto a surface to which an anchor coating has been applied, to form a two-layer film consisting of a substrate layer (A) and an intermediate layer (B). Then, the surface of the intermediate layer (B) may be coated with the peel layer (C) of the present invention, for example, by coating with a gravure coater, a reverse coater, a kiss coater, an air knife coater, a Mayer bar coater or a dip coater. In that case, the surface of the intermediate layer (B) should preferably be subjected to a corona treatment or ozone treatment before coating, of which a corona treatment is particularly preferred. Further, the peel layer (C) coated with the intermediate layer (B) may be coated with a resin composition constituting the heat seal layer (D), for example, by coating with a gravure coater, a reverse coater, a kiss coater, an air knife coater, a Mayer bar coater or a dip coater, to obtain the objective cover film.

As another method, the intermediate layer (B) can be pre-formed by T-die casting or inflation, then dry-laminated onto the substrate layer (A) by adhesion using a polyurethane, polyester or polyolefin adhesive to obtain a film consisting of a substrate layer (A) and an intermediate layer (B), and the surface of the intermediately layer (B) coated with the peel layer (C) and the heat seal layer (D) to obtain the desired cover film.

As yet another method, the desired cover film can also be obtained by sand lamination. In other words, a film constituting a first intermediate layer is formed by T-die casting or inflation. Next, a resin composition mainly comprising melted m-LLDPE is supplied between a film of this first intermediate layer and a film of the substrate layer (A) to form and laminate a second intermediate layer, and after obtaining a film comprising the substrate layer (A) of the desired cover film and an intermediate layer (B) consisting of the first intermediate layer and the second intermediate layer, a peel layer (C) and a heat seal layer (D) are further coated onto the surface on the intermediate layer (B) side to obtain the objective film. As with the above methods, an adhesive should generally be coated onto the surface on the side of the substrate layer (A) to be laminated with film.

In addition to the aforementioned steps, at least one surface of the cover film may be subjected to an antistatic treatment as needed. As the antistatic agent, an anionic, cationic, non-ionic or betaine surfactant type antistatic agent, or a polymer type antistatic agent and a conductive material may be applied using a roll coater with a gravure roll, a lip coater or a sprayer. Additionally, in order to evenly apply the antistatic agent, the film surface should preferably be subjected to a corona discharge treatment or an ozone treatment, preferably a corona discharge treatment, before performing the antistatic treatment.

The cover film is used as a lid material for the carrier tape which is a receptacle for housing electronic components. Carrier tape is a strip-shaped material with a width of about 8 mm to 100 mm having dimples for housing electronic components. When heat sealing a cover film as a lid material, the material constituting the carrier tape is not particularly restricted, and any type that is commercially available may be used, such as polystyrene, polyester, polycarbonate or polyvinyl chloride. When using an acrylic resin in the heat seal layer, it can be suitably combined with polystyrene and polycarbonate carrier tapes. The carrier tape may be made conductive by mixing carbon black or carbon nanotubes into the resin, may have an antistatic agent or a conductive material mixed in, or have a surface coated with a coating having a surfactant type antistatic agent or a conductive material such as a polypyrrole or a polythiophene dispersed in an organic binder of acrylic or the like to provide an antistatic property.

A package housing electronic components can, for example, be obtained by housing electronic components etc. in electronic component receiving portions of carrier tape, then forming a lid using cover film, and continuously heat sealing both edge portions in the longitudinal direction of the cover film to form a package, and winding onto a reel. The electronic components etc. are stored and transported by packaging them in this form. The package housing electronic components etc. is conveyed using holes called sprocket holes for conveying the carrier tape provided on the edge portions in the longitudinal direction of the carrier tape while intermittently peeling away the cover film, and the electronic components etc. are extracted while checking for their presence, orientation and position, then mounted to a substrate by means of a component mounting device.

Furthermore, when peeling away the cover film, if the peel strength is too low, it may separate from the carrier tape and spill out the housed components, whereas if too high, it can become difficult to peel from the carrier tape and tear when peeling the cover film. Therefore, when heat sealed at 120 to 220° C., the peel strength should be 0.05 to 1.0 N, and the variation in the peel strength should preferably be less than 0.4 N.

EXAMPLES

Herebelow, the present invention shall be explained in detail by means of examples, but these should not be considered to limit the present invention.

<Materials Used>

In the Examples and Comparative Examples, the following materials were used in the substrate layer (A), intermediate layer (B), peel layer (C) and heat seal layer (D):

(Substrate Layer (A))

Biaxially stretched polyethylene terephthalate film (Toyobo), thickness 12 μm (Intermediate Layer (B))

m-LLDPE: LL-UL (Futamura Chemical), thickness 40 μm (Resin of Peel Layer (C))

(c-1) Resin: Tuftec H1041 (Asahi Kasei Chemicals), hydrogenated styrene-butadiene-styrene triblock copolymer (SEBS), styrene proportion 30 mass %

(c-2) Resin: Septon 2007 (Kuraray), hydrogenated styrene-isoprene-styrene triblock copolymer (SEPS), styrene proportion 30 mass %

(c-3) Resin: Tuftec H1051 (Asahi Kasei Chemicals), hydrogenated styrene-butadiene-styrene triblock copolymer (SEBS), styrene proportion 42 mass %

(Conductive Material of Resin Layer (C))

(c-4) Conductive Material: FSS-10T (Ishihara Sangyo), acicular antimony-doped tin oxide, number-average length 2 μm, toluene dispersion type (c-5) Conductive Material: SNS-10T (Ishihara Sangyo), spherical antimony-doped tin oxide, median size (D50) 100 nm, toluene dispersion type (c-6) Conductive Material: DCNT-263D-1 (Daido Toryo), carbon nanotubes, diameter 10-20 nm, number-average length 0.1-10 μm (Resin of Heat Seal Layer (D))

(d-1) Resin: Daikalac S-7069A (Daido Chemical), styrenic-acrylic copolymer resin, mass-average molecular weight 9000, glass transition temperature 80° C.

(d-2) Resin: Daikalac S-7069B (Daido Chemical), styrenic-acrylic copolymer resin, mass-average molecular weight 12000, glass transition temperature 80° C.

(d-3) Resin: Daikalac S-7069C (Daido Chemical), styrenic-acrylic copolymer resin, mass-average molecular weight 16000, glass transition temperature 80° C.

(d-4) Resin: Daikalac 8020 (Daido Chemical), styrenic-acrylic copolymer resin, mass-average molecular weight 8000, glass transition temperature 90° C.

(d-5) Resin: Daikalac 8000 (Daido Chemical), styrenic-acrylic copolymer resin, mass-average molecular weight 9000, glass transition temperature 66° C.

(d-6) Resin: Daikalac S-7069D (Daido Chemical), styrenic-acrylic copolymer resin, mass-average molecular weight 22000, glass transition temperature 80° C.

(d-7) Resin: Daikalac 8085 (Daido Chemical), acrylic resin, mass-average molecular weight 4000, glass transition temperature 90° C.

(d-8) Resin: Dianal-BR-113 (Mitsubishi Rayon), acrylic resin, mass-average molecular weight 30000, glass transition temperature 75° C.

(Inorganic Filler to be Added to Heat Seal Layer (D))

(d-9) Inorganic Filler: MEK-ST-ZL (Nissan Chemical), silica filler, median size (D50) 100 nm (d-10) Conductive Material: FSS-10T (Ishihara Sangyo), acicular antimony-doped tin oxide, number-average length 2 μm, toluene dispersion type Example 1

A polyester anchor coating agent was applied by a gravure process to the surface of a biaxially stretched polyester film of thickness 12 μm, which was then laminated by dry lamination with a film of thickness 40 μm consisting of a [m-LLDPE]

polymerized by a metallocene catalyst, resulting in a laminated film consisting of a biaxially stretched polyester layer (substrate layer) and an m-LLDPE layer (intermediate layer). Next, the m-LLDPE surface of this film was subjected to a corona treatment, after which the [(c-1) Resin] dissolved in cyclohexane and an antimony-doped tin oxide dispersion [(c-4) Conductive Material] were mixed at a ratio in solid parts of (c-1):(c-4)=100:300, then the corona-treated surface was coated to a dry thickness of 0.4 μm by a gravure process to form the peel layer. The coated surface of the peel layer was further coated by a gravure process with a solution formed by mixing a random copolymer of styrene resin and methacrylate resin [(d-1) Resin] and [(d-9) Inorganic Filler] so as to have a mass ratio in solid parts of (d-1):(d-9)=100:50 and dissolving in MEK, so as to have a thickness after drying of 0.6 μm to form a heat seal layer, thereby resulting in a cover film for carrier tape having anti-static performance.

Examples 2-10 and Comparative Examples 4-6

A cover film was produced in the same manner as Example 1 aside from the fact that the peel layer and heat seal layer were formed using raw materials such as resins described in Table 1 and Table 2.

Comparative Example 1

A cover film was produced in the same manner as Example 1 aside from the fact that no intermediate layer was provided, and the peel layer and heat seal layer were formed sequentially on the substrate layer of thickness 50 μm.

Comparative Example 2

A cover film was produced in the same manner as Example 1 aside from the fact that no peel layer was provided, and the intermediate layer and heat seal layer were formed using the raw materials such as reins shown in Table 2.

Comparative Example 3

A cover film was produced in the same manner as Example 1 aside from the fact that no heat seal layer was provided, and the intermediate layer and peel layer were formed using the raw materials such as resins shown in Table 2.

<Evaluation Method>

Cover films for use in carrier tapes for electronic components produced according to the examples and comparative examples were evaluated as shown below. The results are shown respectively in Table 1 and Table 2.

(1) Haze

The haze was measured using an integrating sphere type measuring device in accordance with Measuring Method A of JIS K 7105: 1998. The results are shown in the rows of Table 1 and Table 2 labeled "Haze".

(2) Sealing Property

A taping machine (Shibuya Kogyo ETM-480) to heat-seal a 5.5 mm wide cover film to an 8 mm wide polycarbonate carrier tape (Denka) and polystyrene carrier tape (Denka) with a sealing head width of 0.5 mm×2, a sealing head length of 32 mm, a sealing pressure of 0.1 MPa, a feed length of 4 mm and a sealing time of 0.1 seconds×8 with a sealing iron temperature of 140° C. to 190° C. at 10° C. intervals. After letting stand for 24 hours in an atmosphere of temperature 23° C. and a relative humidity of 50%, the cover film was peeled at a peel angle of 170° to 180° at a speed of 300 mm per minute in the same atmosphere of temperature 23° C. and relative humidity 50%, and those with an average peel strength of 0.3 to 0.9 N when heat sealed with a sealing iron temperature of 140° C. to 190° C. at 10° C. intervals were marked "excellent", those having a sealing iron temperature range wherein the average peel strength is in the range of 0.3 to 0.9 N but having a sealing iron temperature range wherein the average peel strength lies outside the range of 0.3 to 0.9 N when heat sealed with a sealing iron temperature of 140° C. to 190° C. at 10° C. intervals were marked "good", and those in which the average peel strength fell outside the range of 0.3 to 0.9 N at all sealing iron temperatures were marked "fail". The results are shown in the rows of Table 1 and Table 2 labeled "Sealing Property".

(3) Variation in Peel Strength

Heat sealing was performed to obtain a peel strength of 0.4 N with respect to polystyrene carrier tape (Denka). The cover film was peeled under the same conditions as in (2) Sealing Property above. The variation in peel strength was derived from a chart obtained when peeling the 100 mm of the cover film in the peel direction. Those with a variation in peel strength of 0.2 N or less were marked "excellent", those with a variation of 0.2 to 0.4 N were marked "good", those with a variation greater than 0.4 N were marked "fail" and those with a peel strength not reaching 0.4 N were marked "n/a". The results are shown in Table 1 and Table 2 in the rows labeled "Variation".

(4) Peeling Speed Dependence of Cover Film

Heat sealing was performed on polystyrene carrier tape (Denka) so as to have a peel strength of 0.4 N. The cover film was peeled under the same conditions as in (2) Sealing Property above. The peeling speed was changed to 2000 mm per minute, and those with an average peel strength of 0.4 to 0.5 N were marked "excellent", those of 0.5 to 0.6 N were marked "good", and those greater than 0.6 N were marked "fail". The results are shown in Table 1 and Table 2 in the rows labeled "Variation".

(5) Rupture Resistance of Cover Film

Heat sealing was performed on polystyrene carrier tape (Denka) so as to have a peel strength of 1.0 N. The cover film was peeled under the same conditions as in (2) Sealing Property above. The carrier tape sealed with the cover film was cut to a length of 550 mm, then the bottoms of the pockets in the carrier tape were applied to a vertical wall on which double-sided adhesive tape was bonded. 50 mm of cover film were peeled from the top portion of the bonded carrier tape, the cover film was pinched by a clip, and a weight with a mass of 1000 g was attached to the clip. After allowing the weight to fall naturally, those in which the cover film did not break in a single sample among 50 samples were marked "excellent", those in which 1 to 5 samples of the cover film broke among 50 samples were marked "good", and those in which at least 5 samples broke were marked "fail". The results are shown in the rows in Table 1 and Table 2 labeled "Film Rupture Resistance".

(6) Peel Strength Stability Over Time

Heat sealing was performed so as to have a peel strength of 0.4 N under the same conditions as in (3) Sealing Property. The results were placed for 7 days in environments of temperature 60° C. and relative humidity 10% and temperature 60° C. and relative humidity 95%, and after removal, were left for 24 hours in an atmosphere of temperature 23° C. and relative humidity 50%, then the peel strengths were measured in the same atmosphere of temperature 23° C. and relative humidity 50%. The measurement of peel strength was performed under the same conditions as (3) Sealing Property above. Those with an average peel strength in the range of 0.4±0.1 N were marked "excellent", those in the range of 0.4±0.2 N were marked "good", and those with an average peel strength outside the above ranges were marked "fail". The results are shown in Table 1 and Table 2 in the rows labeled "Sealing Property".

(7) Baking Resistance 50 electronic components (Stanley LEDs, 1.6 mm×0.8 mm) were placed on the heat seal layer surface of a cover film that was laid flat, then placed for 24 hours in an 80° C. environment. After removal from the 80° C. environment, they were let stand for 1 hour in an atmosphere of temperature 23° C. and a relative humidity of 50%, after which the cover film was inverted in the same atmosphere of temperature 23° C. and relative humidity 50% and the number of electronic components stuck to the cover film were counted. Those wherein the number of components stuck to the cover film was in the range of 0 to 5 were marked "excellent", those in the range of 6 to 10 were marked "good", and those exceeding 10 were marked "fail". The results are shown in Table 1 and Table 2 in the rows labeled "Baking Resistance".

(8) Surface Resistivity

The surface resistivity of a heat seal layer surface with an atmospheric temperature of 23° C., an atmospheric humidity of 50% RH and an applied voltage of 10 V was measured by the method of JIS K6911 using a Mitsubishi Chemical Hiresta-UP MCP-HT450. The results are shown in Table 1 and Table 2 in the rows labeled "Surface Resistivity".

TABLE 1

| | | | Resin Type | Ex 1 | Ex 2 | Ex 3 | Ex 4 | Ex 5 | Ex 6 | Ex 7 | Ex 8 | Ex 9 | Ex 10 |
|---|---|---|---|---|---|---|---|---|---|---|---|---|---|
| Intermediate Layer | m-LLDPE | b-1 | LL-UL | 100 | 100 | 100 | 100 | 100 | 100 | 100 | 100 | 100 | 100 |
| Peel Layer Blend | Resin | c-1 | Tuftec H1041 | 100 | 100 | 100 | 100 | 100 | 100 | 100 | 100 | | |
| | Resin | c-2 | Septone 2007 | | | | | | | | | 100 | |
| | Resin | c-3 | Tuftec H1051 | | | | | | | | | | 100 |
| | Conductive Material | c-4 | FSS-10T | 300 | 300 | 300 | 300 | 300 | | | | 300 | 300 |
| | Conductive Material | c-5 | SNS-10T | | | | | | 800 | | | | |
| | Conductive Material | c-6 | DCNT-263D-1 | | | | | | | 15 | | | |
| Heat Seal Layer Blend | Resin | d-1 | Daikalac S-7069A | 100 | | | | | 100 | 100 | 100 | 100 | 100 |
| | Resin | d-2 | Daikalac S-7069B | | 100 | | | | | | | | |
| | Resin | d-3 | Daikalac S-7069C | | | 100 | | | | | | | |
| | Resin | d-4 | Daikalac 8020 | | | | 100 | | | | | | |
| | Resin | d-5 | Daikalac 8000 | | | | | 100 | | | | | |
| | Resin | d-6 | Daikalac S-7069D | | | | | | | | | | |
| | Resin | d-7 | Daikalac 8085 | | | | | | | | | | |
| | Resin | d-8 | Dianal BR-113 | | | | | | | | | | |
| | Inorganic Filler | d-9 | MEK-ST-ZL | 50 | 50 | 50 | 50 | 50 | 30 | 50 | | 50 | 50 |
| | Conductive Material | d-10 | FSS-10T | | | | | | | | 300 | | |
| Evaluated Physical Properties, etc. | Substrate layer thickness; μm | | | 12 | 12 | 12 | 12 | 12 | 12 | 12 | 12 | 12 | 12 |
| | Intermediate layer thickness; μm | | | 40 | 40 | 40 | 40 | 40 | 40 | 40 | 40 | 40 | 40 |
| | Peel layer thickness; μm | | | 0.4 | 0.4 | 0.4 | 0.4 | 0.4 | 0.3 | 0.8 | 0.8 | 0.4 | 0.4 |
| | Heat seal layer thickness; μm | | | 0.6 | 0.6 | 0.6 | 0.6 | 0.6 | 0.6 | 0.6 | 0.4 | 0.6 | 0.6 |
| | Cover film thickness; μm | | | 53 | 53 | 53 | 53 | 53 | 52.9 | 53.4 | 53.2 | 53 | 53 |
| | (1) Haze; % | | | 9 | 9 | 9 | 8 | 8 | 30 | 10 | 15 | 10 | 10 |
| | (2) Sealing property | 1 | polycarbonate tape | exc | exc | exc | exc | exc | exc | exc | exc | exc | good |
| | | 2 | polystyrene tape | exc | exc | exc | exc | exc | exc | exc | exc | exc | good |
| | (3) Variation in peel strength | | | exc | exc | exc | exc | exc | exc | exc | exc | exc | good |
| | (4) Cover film speed dependent; 300 to 2000 mm/min | | | exc | exc | good | exc | exc | exc | exc | exc | exc | exc |
| | (5) Cover film rupture resistance | | | exc | exc | exc | exc | exc | exc | exc | exc | exc | exc |
| | (6) Peel strength stability over time | | | exc | exc | exc | exc | exc | exc | exc | exc | exc | exc |
| | (7) Baking resistance | | | exc | exc | exc | exc | good | exc | good | exc | exc | exc |
| | (8) Surface resistance; Ω | | | 4E+08 | 5E+08 | 6E+08 | 4E+08 | 4E+08 | 5E+08 | 7E+08 | 1E+08 | 5E+08 | 3E+08 |

TABLE 2

| | | | Resin Type | Co Ex 1 | Co Ex 2 | Co Ex 3 | Co Ex 4 | Co Ex 5 | Co Ex 6 |
|---|---|---|---|---|---|---|---|---|---|
| Intermediate Layer | m-LLDPE | b-1 | LL-UL | | 100 | 100 | 100 | 100 | 100 |
| Peel Layer Blend | Resin | c-1 | Tuftec H1041 | 100 | | 100 | 100 | 100 | 100 |
| | Resin | c-2 | Septone 2007 | | | | | | |
| | Resin | c-3 | Tuftec H1051 | | | | | | |
| | Conductive Material | c-4 | FSS-10T | 300 | | 300 | 300 | 300 | 300 |
| | Conductive Material | c-5 | SNS-10T | | | | | | |
| | Conductive Material | c-6 | DCNT-263D-1 | | | | | | |

TABLE 2-continued

| | Resin Type | | | Co Ex 1 | Co Ex 2 | Co Ex 3 | Co Ex 4 | Co Ex 5 | Co Ex 6 |
|---|---|---|---|---|---|---|---|---|---|
| Heat Seal Layer Blend | Resin | d-1 | Daikalac S-7069A | 100 | 100 | | | | |
| | Resin | d-2 | Daikalac S-7069B | | | | | | |
| | Resin | d-3 | Daikalac S-7069C | | | | | | |
| | Resin | d-4 | Daikalac 8020 | | | | | | |
| | Resin | d-5 | Daikalac 8000 | | | | | | |
| | Resin | d-6 | Daikalac S-7069D | | | | 100 | | |
| | Resin | d-7 | Daikalac 8085 | | | | | 100 | |
| | Resin | d-8 | Dianal BR-113 | | | | | | 100 |
| | Inorganic Filler | d-9 | MEK-ST-ZL | 50 | 50 | | 50 | 50 | 50 |
| | Conductive Material | d-10 | FSS-10T | | | | | | |
| Evaluated Physical Properties, etc. | Substrate layer thickness; μm | | | 50 | 12 | 12 | 12 | 12 | 12 |
| | Intermediate layer thickness; μm | | | 0 | 40 | 40 | 40 | 40 | 40 |
| | Peel layer thickness; μm | | | 0.4 | 0 | 0.4 | 0.4 | 0.4 | 0.4 |
| | Heat seal layer thickness; μm | | | 0.6 | 0.6 | 0 | 0.6 | 0.6 | 0.6 |
| | Cover film thickness; μm | | | 51 | 52.6 | 52.4 | 53 | 53 | 53 |
| | (1) Haze; % | | | 8 | 9 | 25 | 10 | 10 | 10 |
| | (2) Sealing property | 1 | polycarbonate tape | fail | fail | good | exc | exc | exc |
| | | 2 | polystyrene tape | fail | fail | good | exc | exc | exc |
| | (3) Variation in peel strength | | | fail | fail | good | exc | exc | exc |
| | (4) Cover film speed dependent; 300 to 2000 mm/min | | | n/a | n/a | fail | fail | exc | fail |
| | (5) Cover film rupture resistance | | | n/a | n/a | fail | fail | exc | fail |
| | (6) Peel strength stability over time | | | n/a | n/a | exc | exc | exc | good |
| | (7) Baking resistance | | | exc | exc | fail | exc | fail | exc |
| | (8) Surface resistance; Ω | | | 3E+08 | >1E+14 | 3E+08 | 5E+08 | 4E+08 | 4E+08 |

DESCRIPTION OF THE REFERENCE NUMBERS

1 cover film
2 substrate layer (A)
3 anchor coat layer
4 intermediate layer (B)
5 peel layer (C)
6 heat seal layer (D)

The invention claimed is:

1. A cover film comprising at least a substrate layer, an intermediate layer, a peel layer and a heat seal layer capable of being heat-sealed to a carrier tape;
   wherein the peel layer comprises, as a main component, a hydrogenated aromatic vinyl-conjugated diene copolymer having an aromatic vinyl content of 15 to 35 mass %,
   the thickness of the substrate layer is 12 to 25 μm, the thickness of the intermediate layer is 5 to 50 μm, the thickness of the peel layer is 0.1 to 3 μm and the thickness of the heat seal layer is 0.1 to 5 μm, and
   the heat seal layer comprises, as a main component, a styrenic-acrylic copolymer having a mass-average molecular weight of 5000 to 20000.

2. The cover film according to claim 1, wherein the styrenic-acrylic copolymer of the heat seal layer is a resin having a glass transition temperature of 70 to 100° C.

3. The cover film according to claim 1, wherein the peel layer and/or the heat seal layer comprises a conductive material.

4. The cover film according to claim 3, wherein the conductive material is conductive microparticles, comprising acicular or spherical microparticles, or a combination thereof.

5. The cover film recited in claim 3, wherein the conductive material is a carbon nano-material.

6. An electronic component package comprising, as a lid material of a carrier tape having a thermoplastic resin as the main component, the cover film according to claim 1.

7. The cover film according to claim 1, wherein the substrate layer comprises a biaxially stretched polyester or a biaxially stretched nylon.

8. The cover film according to claim 1, wherein the intermediate layer comprises a linear low-density polyethylene (LLDPE).

9. The cover film according to claim 8, wherein the LLDPE is polymerized by a metallocene catalyst and is a copolymer of ethylene and an olefin having from 3 to 18 carbon atoms.

10. The cover film according to claim 1, wherein the peel layer comprises a hydrogenated styrene-isoprene-styrene triblock copolymer resin (SEPS) or a hydrogenated styrene-butadiene-styrene triblock copolymer resin (SEBS).

11. The cover film according to claim 1, wherein the peel layer has a thickness of from 0.1 to 1.5 μm.

12. The cover film according to claim 1, wherein the styrenic-acrylic copolymer has a mass-average molecular weight of 10,000 to 20,000.

13. The cover film according to claim 1, wherein the styrenic-acrylic copolymer has a glass transition temperature of 70° C. to 100° C.

14. The cover film according to claim 1, wherein the heat seal layer has a thickness of from 0.1 to 3 μm.

15. The cover film according to claim 1, wherein the heat seal layer has a thickness of from 0.1 to 0.5 μm.

* * * * *